United States Patent [19]
Lin

[11] Patent Number: 5,237,596
[45] Date of Patent: Aug. 17, 1993

[54] STEPPING COUNTER USING RESONANT TUNNELING DIODES

[75] Inventor: Hung C. Lin, Silver Spring, Md.

[73] Assignee: University of Maryland, College Park, Md.

[21] Appl. No.: 774,526

[22] Filed: Oct. 8, 1991

[51] Int. Cl.⁵ .......................................... H03K 29/00
[52] U.S. Cl. ...................................... 377/98; 377/128; 307/322
[58] Field of Search .................... 307/322; 377/98, 94, 377/95, 128

[56] References Cited

U.S. PATENT DOCUMENTS

| | | | |
|---|---|---|---|
| 3,094,630 | 6/1963 | Rapp et al. | 377/128 |
| 3,094,631 | 6/1963 | Davis | 377/94 |
| 3,142,765 | 7/1964 | Wine | 377/95 |
| 3,181,005 | 4/1965 | Scarr et al. | 377/94 |
| 3,184,614 | 5/1965 | Harrison | 377/128 |
| 3,187,193 | 6/1965 | Rappaport et al. | 307/322 |
| 3,230,311 | 1/1966 | Dersch | 377/128 |
| 3,569,733 | 3/1971 | Weischedel et al. | 307/322 |
| 3,996,484 | 12/1976 | Abraham | 307/322 |
| 4,831,340 | 5/1989 | Sullner | 307/322 |
| 4,853,753 | 8/1989 | Capasso et al. | 257/25 |
| 4,907,045 | 3/1990 | Ando | 257/24 |
| 5,033,069 | 7/1991 | Lin et al. | 377/98 |

FOREIGN PATENT DOCUMENTS 0934299 8/1963 United Kingdom ................ 307/322

OTHER PUBLICATIONS

Robert C. Potter, et al. "Signal Processing with Vertically-Integrated Resonant Tunneling Diodes", Internat'l Symposium on Circuits & Systems, May 1, 1990.

Amir A. Lakhani, et al. "Combining Resonant Tunneling Diodes for Signal Processing and Multilevel Logic", Appl. Phys. Lett. vol. 52, No. 20, May 1988, pp. 1684-1685.

Z. C. Tan, et al. "Series-Connected Tunnel-Diode-Scaler Design Considerations", Electronic Engineering, Oct. 1967, pp. 624-629.

Primary Examiner—John S. Heyman
Attorney, Agent, or Firm—Oblon, Spivak, McClelland, Maier & Neustadt

[57] ABSTRACT

A stepping counter using resonant tunneling diodes (RTDs). The stepping counter utilizes the periodic hysteresis characteristic of a device with folding characteristics such as a RTD connected in series with a resistance. The series circuit is biased in the upper portion of the hysteresis loop through a current source in the case of a step-up counter. When a positive-going pulse is applied through a capacitor across the series RTD-resistor circuit, the operating point jumps to the next highest stable operating point in the hysteresis loop responsive to the leading edge of the pulse, but is prevented from returning to the original operating point at the trailing edge of the pulse because of the hysteresis.

20 Claims, 3 Drawing Sheets

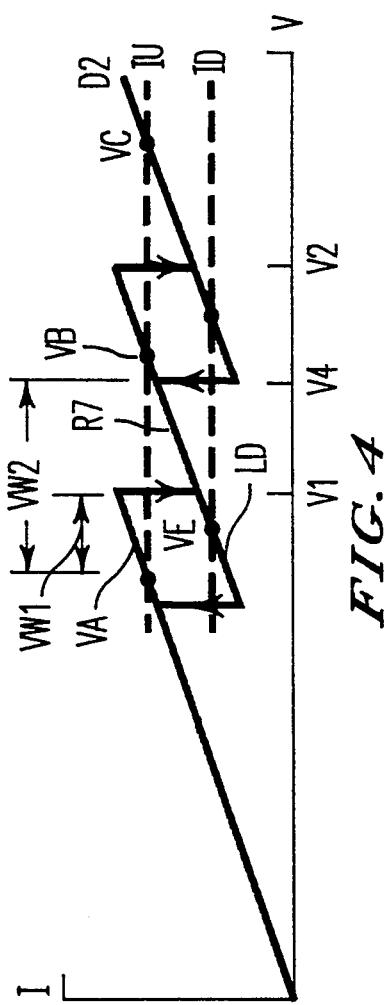
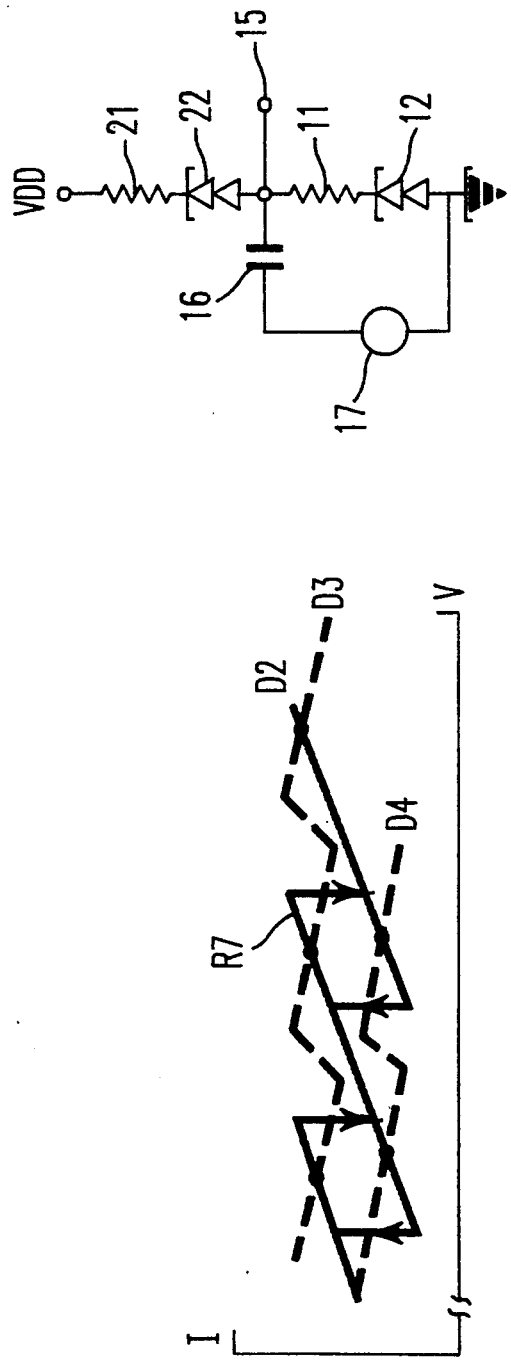
FIG. 4
FIG. 7
FIG. 8

STEPPING COUNTER USING RESONANT TUNNELING DIODES

BACKGROUND OF THE INVENTION

1. Field of the Invention

The present invention relates to electronic stepping counters using resonant tunneling diodes, and in particular to stepping counters using the periodic hysteresis characteristic of a resonant tunneling diode connected in series with a resistance.

2. Discussion of the Background

Electronic stepping counters are widely used in the art, and have numerous and various applications. It has also been suggested that resonant tunneling diodes (RTDs) may be used in multi-level logic circuits. In Potter et al, 1990 International Symposium on Circuits and Systems (May, 1990), a multi-level logic circuit is disclosed having stable operating points defined by the intersection of a load line with the folding characteristic of the RTD. However, defining the stable operating points in this manner allows only a limited number of points to be defined and requires rather large resistances to define a larger number of operating points, which is a great disadvantage in attempting to miniaturize the multi-level logic circuit and to obtain high speed operation.

Tan et al, Electronic Engineering, pp. 624–629 (October, 1967) connect a number of tunnel diodes in series to form a chain and bias the chain with a constant current source to produce a number of stable states in the positive resistance regions of the tunnel-diode chain output characteristic. Tan et al form a decade-scaler using the tunnel-diode chain. The circuit of Tan et al requires that the fall time of the voltage pulse be increased to avoid erroneous resetting of the circuit during the trailing edge transition of the input pulse, which severely limits the operating speed of the circuit. Thus, it is not possible to build high speed stepping counters using the circuit of Tan et al.

SUMMARY OF THE INVENTION

It is therefore an object of the present invention to provide a novel electronic stepping counter which overcomes the disadvantages noted above.

Another object of the present invention is to utilize the folding characteristic of resonant tunneling diodes to implement the stepping function in the stepping counter according to the invention.

A further object of the present invention is to provide a stepping counter with a non-critical triggering voltage.

These and other objects are achieved by a stepping counter with a device having folding voltage-current characteristics including a plurality of hysteresis loops. A current source is connected to the device, which supplies an operating current to the device, the operating current being selected to define operating points in each of hysteresis loops. The operating points correspond to output voltage levels of the stepping counter. Pulse means are also connected to the device for producing a voltage pulse for switching between the operating points.

In a first embodiment of the present invention, the stepping counter is configured as a step-up counter where the pulse means comprises a positive-going pulse generator and the current source supplies an operating current selected to define one of the operating points in an upper portion in each of the hysteresis loops.

When this embodiment is configured as a step-down counter, the pulse means comprises a negative-going pulse generator and the current source supplies an operating current selected to define one of the operating points in a lower portion of each of the hysteresis loops.

The stepping counter according to the invention may also include resetting means for resetting the stepping counter to a selected of the operating points, particularly when the operating point having a maximum voltage has been reached during the counting operation.

The device with folding voltage-current characteristics may comprise a resonant tunneling diode having a multi-peak voltage-current characteristic connected in series with a resistor. The value of the resistor is selected to have a value of resistance larger than a magnitude of negative-going resistance portions of the multi-peak current characteristic of the resonant tunneling diode. The resistor may also have a value selected such that a load line of the resistor intersects the multi-peak current characteristic at a current peak thereof.

In a second embodiment according to the invention, the current source may be also implemented using a series connection of a second resonant tunneling diode and a resistor biased with a power supply to produce a multi-peaked operating current without hysteresis having a minimum current value greater than a minimum current value of the hysteresis loops, and intersecting positive-going portions of the folding voltage-current characteristic only once in each of the positive-going portions. This operating current effects a step-up operation of the stepping counter according to the invention.

A step-down operation can be effected if the current source producing a multi-peaked operating current without hysteresis has a maximum current value less than a maximum current value of the hysteresis loops and intersects positive-going portions of the folding voltage-current characteristics only once in each of the positive-going portions. By using a current source comprising a series connection of the resonant tunneling diode and the resistor, the current source and the stepping counter can be formed in single monolithic structure.

In a third embodiment according to the present invention, the current source comprises a variable current source and the stepping counter further comprises means for selectively setting a value of the operating current to define an operating point in at least one of each of an upper portion of the hysteresis loops and each of a lower portion of the hysteresis loops.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a plot illustrating the operating points of the resonant tunneling diode, when positive pulses are used for stepping up the output voltage;

FIG. 7 is a plot of the operating points when a folding current source is used for step-up counting;

FIG. 8 is a circuit diagram of a second embodiment of the present invention for implementing the function of FIG. 7 using a RTD as a current source.

DETAILED DESCRIPTION OF THE PREFERRED EMBODIMENTS

Figure 2:
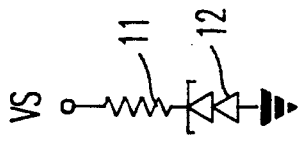
FIG. 2 is a circuit diagram of the basic sub-circuit for producing a hysteretic folding characteristic.
Figure 1:
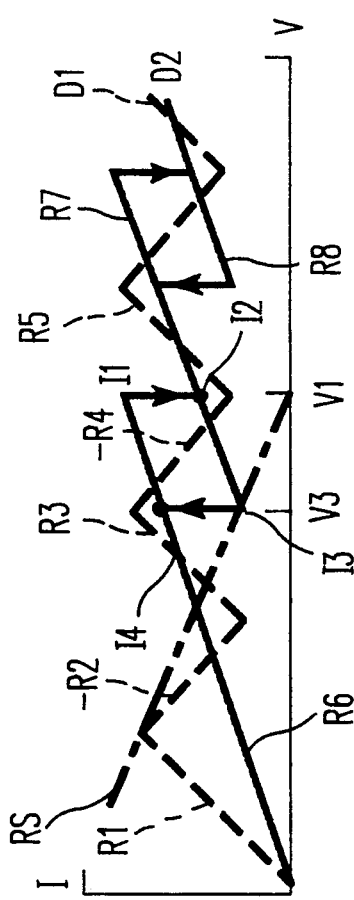
FIG. 1 is a plot of the folding V-I characteristics of a resonant tunneling diode and the effect of series resistance.

Referring now to the drawings, wherein like reference characters designate like or corresponding parts throughout the several views and more particularly to FIG. 1 thereof, wherein the voltage-current (V-I) relationship of a resonant tunneling diode (RTD) is shown as the curve labelled D1, illustrating the triangular or folding characteristic. In curve D1, sections R1, R3 and R5 have positive resistance while sections −R2 and −R4 have negative resistance. Referring to FIG. 2, when a resistor 11, having a resistance larger than the magnitude of the negative resistance of the V-I characteristic is connected in series with a RTD 12, the folding characteristic is modified to have hysteresis as shown by curve D2 in FIG. 1. The hysteresis can be obtained graphically by plotting the load line Rs of the resistor 11 as shown by the dot-dash line of FIG. 1. As the voltage VS across the series RTD-resistor sub-circuit increases from the origin along the voltage axis, the current increases as shown in the first leg of the D2 curve. A point V1 will be reached which is defined as the intersection with the voltage axis of a load line passing through a current peak of curve D1. At voltage V1, there are two corresponding current points on curve D2, namely, a maximum current I1 along section R6 and a minimum current I2 along section R7. Then as VS increases, the current value jumps from the I1 value down to the I2 value along curve D2. A further increase in VS moves the current along section R7 of curve D2.

In retracing, VS is decreased and moves back along section R7 of curve D2 until voltage V3 is reached, having a corresponding minimum current value I3. When VS decreases further, the current value jumps to I4 and then retraces back along section R6. Thus, there is defined a hysteresis curve with a clockwise loop around I1, I2, I3 and I4. The present invention utilizes this hysteresis characteristic to implement a stepping function.

Figure 3:
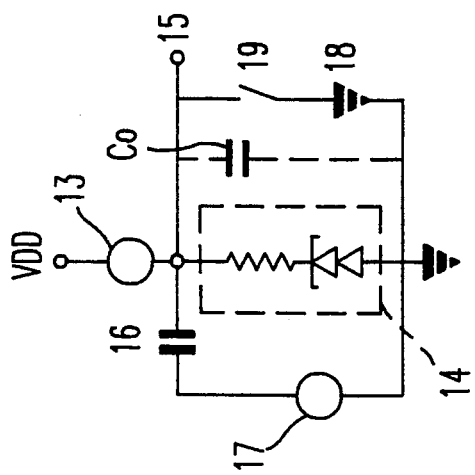
FIG. 3 is a circuit diagram of the basic stepping counter circuit according to the invention.

Referring to FIG. 3, a first embodiment of the stepping counter according to the present invention is shown. A constant current source 13 is connected in series with the resistor-RTD subcircuit 14 across a DC power supply VDD. A pulse generator 17 is coupled through a capacitor 16 to node 15 which is the connection between the current source 13 and subcircuit 14. Also connected between node 15 and ground is a reset switch 19 and a DC voltage source 18.

When the stepping counter implements step-up counting, current source 13 has a characteristic shown by the dotted line IU in FIG. 4. Current source 13 biases subcircuit 14 in the upper loop LU of the hysteretic folding characteristic at operating points corresponding to voltages VA, VB and VC. As an example, assume the operating point is initially set to VA. When a positive voltage pulse V+ is applied having an amplitude which is larger than the difference VW1 between the peak voltage V1 and VA and smaller than a difference VW2 between peak voltage V2 and VA, the leading edge triggers a voltage transition from VA to VB. V+ has a magnitude preferably between VW1 and VW2. The mechanism for producing this transition is due to the fact that the charging current IU of any capacitance ($C_0$) at the node 15 is larger than a discharging current along the positive resistance section R7 of curve D3 of FIG. 4. The capacitance $C_0$ is eventually charged up to the quiescent operating point VB. When the charging current and the discharging current are equal, an equilibrium condition is reached. The current through subcircuit 14 does not drop to the lower loop LD since both current source 13 and pulse voltage supply 17 supply charging current.

On the trailing edge of the voltage pulse, the current retraces back along section R7, but by way of the lower loop LD. Pulse generator 17 now pulls current away from the output node 15 and the RTD thus has a lower current than the current output from current source 13. Since the negative-going trailing edge has the same amplitude as the positive-going leading edge, the negative-going transient can not retrace below the original quiescent voltage VA. Thus, after the trailing edge transient, there is no more current flowing through capacitor 16 and current source 13 forces the operating point to return to the equilibrium value at the point along section R9 defined by VB. One positive voltage pulse thus moves the operating point of the stepping counter from VA to VB.

Defining the operating points in the hysteresis loops allows rapid switching without any danger of erroneously resetting the operating point, thereby obtaining a high speed electronic counter. Moreover, a range of magnitudes of input voltage pulses are available to effect the switching operation, i.e. a noncritical triggering voltage, allowing flexibility in the stepping counter design and operation.

Figure 5:
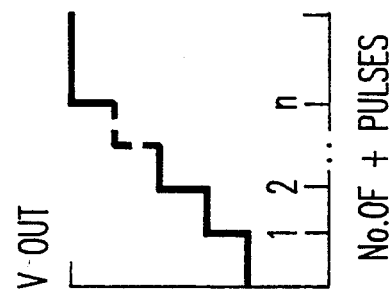
FIG. 5 is a graph of the output of the step-up counter according to the invention in response to positive pulses.

In the same manner as described above, the next positive pulse triggers a transition of the operating point from VB to VC. The output voltage is thus stepped up by a step equal to the pitch of the D2 curve. When several pulses are applied, the characteristic shown in FIG. 5 is produced, where VOUT is the voltage at node 15, and a stepping function is implemented. As is apparent from FIG. 4, there can be as many steps as there are peaks in the folding characteristic of subcircuit 14. When the number of pulses equals the number of peaks of the RTD, that is, the operating point having the highest voltage has been reached, applying a further positive-going pulse can not further step up the output voltage and a plateau is reached. After reaching the last step, the operating point can be reset to VA, or some other operating point as desired, with a resetting switch 17 connected to a voltage source 18. For example, if it is desired to reset the stepping counter to the operating point at VA, then the value of voltage source 18 can be set to any value less than the first peak voltage V1. Similarly, if it is desired to reset the operating point of the stepping counter according to the invention to VB, then the value of voltage source 18 should be selected to be between the first peak voltage V1 and second peak voltage V2 (see FIG. 4). In this manner, a stepping counter according to the invention can be reset to any desired quiescent operating point.

The stepping counter according to the invention can also be used as a step-down counter to count down, if the current source 13 biases the operating points to be in the lower halves of the hysteresis loops producing operating points VD and VE, as shown by the current line ID intersecting curve D2 of FIG. 4. To step down, a negative pulse V− should be applied from the voltage generator 17. V− preferably has the same magnitude as V+ described above. As an example, if the original operating point is set at VD, then the leading edge of the negative pulse V−, which triggers the voltage at node 15 to be less than the minimum voltage V4 of the hysteresis loop, produces a transition of the operating point to the next lower operating point, VE. The step-down action is a dual of the positive-going action. The negative-going pulse pulls current from the node 15 and lowers the voltage at node 15 until the equilibrium voltage VE is reached.

Figure 6:
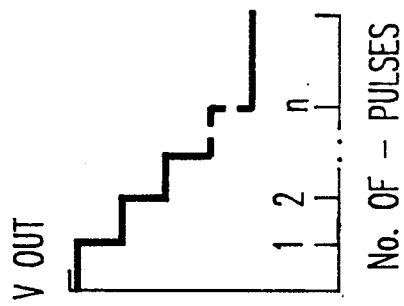
FIG. 6 is a plot of the output of the step-down counter according to the invention in response to negative pulses.

At the trailing edge of the negative pulse V−, the voltage at node 15 retraces along section R7 of curve D2 toward VB, but is unable to be higher than the second peak voltage V2. No further current flows through capacitor 16 after the trailing edge transition. Then, the current source 13 producing a current ID forces node 15 to fall back to VE. The output voltage is stepped down by one level. In this manner, if there are a plurality of pulses V− applied, (1, 2 . . . n), a step-down waveform is produced (as shown in FIG. 6).

Current source 13 of FIG. 3 can be any conventional type such as those using bipolar transistors or field effect transistors, as will be apparent to one skilled in the art. Further, current source 13 need not be a constant one, so long as the current source can bias the circuit to the desired quiescent operating points VA, VB, VC, VD and VE etc.

In a second embodiment of the present invention, a current source with a folding V-I characteristic such as curve D3 shown in FIG. 7 may be used. Curve D3 exhibits folding characteristics having a different peak to value ratio than the folding characteristic of RTD 12. FIG. 8 is a circuit diagram of the second embodiment according to the invention. A second RTD 22 placed in series with a second resistor 21 can produce the current characteristic D3 of FIG. 7. In this mode of operation, curve D3 should lie above the minimum voltage of the hysteresis loop and should intersect with the positive-going resistance sections of curve D2 only once. Otherwise, there would be more than n+1 stable operating points and the stepping characteristic shown in FIG. 5 could not be obtained.

For a step-down counter, the current source formed by the combination of RTD 22 and resistor 21 can be biased to produce folding characteristic D4, as shown in FIG. 7. In this mode of operation, the peaks of the folding characteristic D4 should intersect with the lower halves of the hysteresis loops of characteristic D2. However, the peaks of the current source curve D4 should not intersect with the upper loop characteristics and should intersect the positive-going portions of the curve D2 only once. Otherwise, as in the case of the step-up counter, there would be more than n+1 operating points and the stepping-down characteristics shown in FIG. 6 could not be obtained. Similar to the first embodiment, the second embodiment may also have a reset switch 19 and voltage source 18 to reset the stepping counter to a desired operating point.

When a RTD and a resistor is used as a current source, as in the second embodiment according to the invention, the current source and the hysteretic RTD subcircuit can be integrated in a monolithic structure. The resistors can also be integrally formed from the semiconductor material used to fabricate the RTD, as would be apparent to one skilled in the art.

Figure 9:
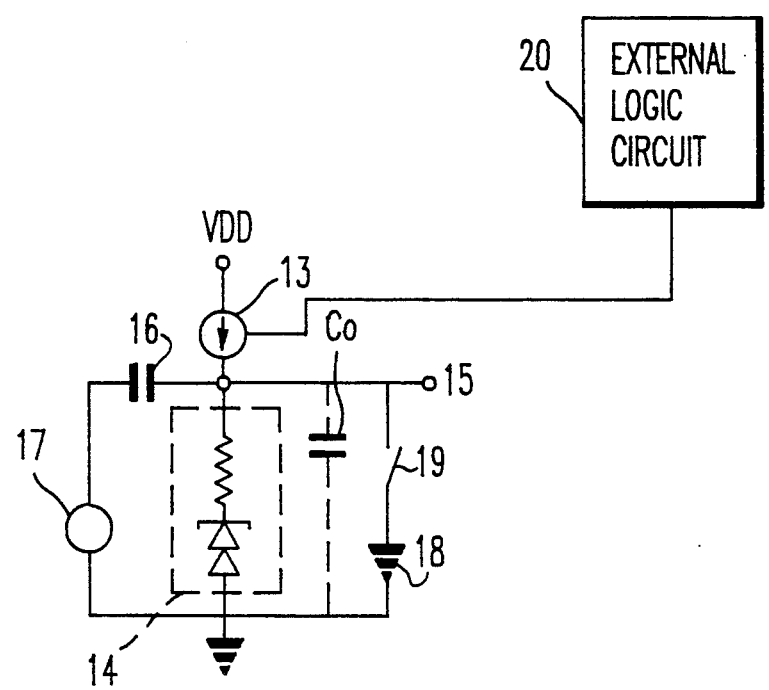
FIG. 9 is a circuit diagram of a third embodiment of the present invention.

A third embodiment of the present invention is shown in FIG. 9, wherein the current supply 13 comprises a variable current source capable of producing the current levels IU and ID, shown in FIG. 4, thereby forming a counter capable of both stepping up and stepping down. The mode switching between stepping up and stepping down can be controlled via an external logic circuit 20, such as a microprocessor (not shown), as will be apparent to one skilled in the art.

While the present invention is directed to a stepping counter using resonant tunneling diodes, it is to be understood that the present invention is in no way limited to stepping counters, and is applicable to any type of circuit or arrangement in which a staircase-type output voltage characteristic is desired. For example, the present invention is applicable to decade scalers and multi-level logic circuits.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent or the United States is:

1. A stepping counter, comprising:
   a device having a folding voltage-current characteristic with a plurality of predetermined hysteresis loops each having at least one operating portion and at least one transition portion, such that in each of said loops, two different corresponding current levels are obtained for a given voltage level;
   a current source, connected to said device at a node, for supplying an operating current to said device, said operating current being selected to define an operating point in an operating portion of each of said hysteresis loops, said operating points corresponding to output voltage levels of said stepping counter; and
   pulse means, connected to said node, for producing a voltage pulse supplied to said node for switching between said operating points.

2. A counter as recited in claim 1, wherein:
   said pulse means comprises a positive-going pulse generator; and
   said current source supplies an operating current selected to define one of said operating points in an upper portion of each of said hysteresis loops.

3. A counter as recited in claim 1, wherein:
   said pulse means comprises a negative-going pulse generator; and
   said current source supplies an operating current selected to define one of said operating points in a lower portion of each of said hysteresis loops.

4. A counter as recited in claim 1, further comprising resetting means for resetting said stepping counter to a selected of said operating points.

5. A counter as recited in claim 1, wherein said device comprises a resonant tunneling diode having a multi-peak voltage-current characteristic connected in series with a resister.

6. A counter as recited in claim 5, wherein said resistor has a value of resistance such that a load line of said resistor intersects said multi-peak current characteristic at a current peak thereof.

7. A counter as recited in claim 5, wherein said resistor has a value of resistance larger than a magnitude of negative-going resistance portions of said multi-peak current characteristic.

8. A counter as recited in claim 7, wherein:
said pulse means comprises a positive-going pulse generator; and
said current source supplies an operating current selected to define one of said operating points in an upper portion of each of said hysteresis loops.

9. A counter as recited in claim 1, wherein:
said current source comprises a variable current source; and
said stepping counter further comprises means for selectively setting a value of said operating current to define one of said operating points in at least one of each of an upper portion of said hysteresis loops and each of a lower portion of said hysteresis loops.

10. A counter as recited in claim 1, wherein said current source comprises a series connection of a resonant tunneling diode and a resistor biased with a power supply.

11. A counter as recited in claim 10, wherein said current source and said device are formed in a single monolithic structure.

12. A stepping counter, comprising:
a device having a folding voltage-current characteristic with a plurality of hysteresis loops;
a current source, connected to said device at a node, for supplying an operating current to said device, said operating current being selected to define an operating point in each of said hysteresis loops, said operating points corresponding to output voltage levels of said stepping counter; and
pulse means, connected to said node, for producing a voltage pulse supplied to said node for switching between said operating points;
wherein said current source comprises a series connection of a resonant tunneling diode and a resistor biased with a power supply; and
wherein said current source produces a multi-peaked operating current without hysteresis having a maximum current value less than a maximum current value of said hysteresis loops and intersecting positive-going portions of said folding voltage-current characteristic only once in each of said positive-going portions.

13. A stepping counter, comprising:
a device having a folding voltage-current characteristic with a plurality of hysteresis loops;
a current source, connected to said device at a node, for supplying an operating current to said device, said operating current being selected to define an operating point in each of said hysteresis loops, said operating points corresponding to output voltage levels of said stepping counter; and
pulse means, connected to said node, for producing a voltage pulse supplied to said node for switching between said operating points;
wherein said current source comprises a series connection of a resonant tunneling diode and a resistor biased with a power supply; and
wherein said current source produces a multi-peaked operating current without hysteresis having a minimum current value greater than a minimum current value of said hysteresis loops and intersecting positive-going portions of said folding voltage-current characteristic only once in each of said positive-going portions.

14. A counter as recited in claim 13, wherein said current source produces a current selected to define one of said operating points in an upper portion of each of said hysteresis loops.

15. A counter as recited in claim 12, wherein said current source produces a current selected to define one of said operating points in an lower portion of each of said hysteresis loops.

16. A stepping counter comprising:
a device having a first multi-peak folding voltage-current characteristic with a plurality of hysteresis loops formed by connecting in series a resonant tunnelling diode having a second multi-peak folding voltage-current characteristic with a resistor having a value of resistance larger than a magnitude of negative-going resistance portions of said second multi-peak folding voltage-current characteristic;
a current source, connected to said device at a node, for supplying an operating current to said device, said operating current being selected to define an operating point in at least one of each of an upper portion of said hysteresis loops and each of a lower portion of said hysteresis loops, said operating points corresponding to output voltage levels of said stepping counter; and
pulse means, connected to said node, for producing a voltage pulse for switching between said operating points; and
resetting means for resetting said stepping counter to a selected of said operating points.

17. A counter as recited in claim 16, wherein said current source comprises a series connection of a resonant tunneling diode and a resistor biased with a power supply.

18. A counter as recited in claim 17, wherein said current source produces a multi-peaked operating current without hysteresis having a minimum current value greater than a minimum current value of said hysteresis loops and intersecting positive-going portions of said first multi-peak folding voltage-current characteristic only once in each of said positive-going portions.

19. A counter as recited in claim 17, wherein said current source produces a multi-peaked operating current without hysteresis having a maximum current value less than a maximum current value of said hysteresis loops and intersecting positive-going portions of said first multi-peak folding voltage-current characteristic only once in each of said positive-going portions.

20. A counter as recited in claim 17, wherein said current source and said device are formed in a single monolithic structure.

* * * * *